United States Patent [19]
Shahidi et al.

[11] Patent Number: 5,298,786
[45] Date of Patent: Mar. 29, 1994

[54] SOI LATERAL BIPOLAR TRANSISTOR WITH EDGE-STRAPPED BASE CONTACT AND METHOD OF FABRICATING SAME

[75] Inventors: Ghavam G. Shahidi, White Plains; Denny D. Tang, Pleasantville; Yuan Taur, Bedford, all of N.Y.

[73] Assignee: International Business Machines Corp., Armonk, N.Y.

[21] Appl. No.: 93,515

[22] Filed: Jul. 19, 1993

Related U.S. Application Data

[63] Continuation of Ser. No. 890,357, May 22, 1992, abandoned, which is a continuation of Ser. No. 622,986, Dec. 6, 1990, abandoned.

[51] Int. Cl.$^5$ ............................................. H01L 29/72
[52] U.S. Cl. .................................... 257/559; 257/526; 257/588; 257/593; 257/640; 257/754; 257/756
[58] Field of Search ................. 357/34; 257/511, 525, 257/526, 557, 559, 575, 588, 593, 754, 755, 756, 635, 640

[56] References Cited

U.S. PATENT DOCUMENTS

| | | |
|---|---|---|
| 4,050,965 | 9/1977 | Ipri et al. . |
| 4,161,745 | 7/1979 | Slob .......................................... 357/34 |
| 4,678,537 | 7/1987 | Ohuchi ................................. 257/588 |
| 4,722,908 | 2/1988 | Burton ................................... 357/34 |
| 4,785,341 | 11/1988 | Ning et al. . |
| 4,792,837 | 12/1988 | Zazzu . |
| 4,808,546 | 2/1989 | Moniwa et al. ....................... 437/59 |
| 4,900,689 | 2/1990 | Bajor et al. .......................... 357/34 |
| 4,908,324 | 3/1990 | Nihira et al. ......................... 357/34 |
| 5,027,177 | 6/1991 | Vasudev ............................... 357/34 |

FOREIGN PATENT DOCUMENTS

| | | |
|---|---|---|
| 0137992 | 4/1985 | European Pat. Off. . |
| 2198285 | 6/1988 | United Kingdom . |

OTHER PUBLICATIONS

"Lateral Bipolar Transistor with Elevated Base Contact" *IBM Technical Disclosure Bulletin*, 32(6B)157 (1989) pp. 157-159.

*Primary Examiner*—J. Carroll
*Attorney, Agent, or Firm*—Scully, Scott, Murphy & Presser

[57] ABSTRACT

A silicon-on-insulator lateral bipolar transistor having an edge-strapped base contact is disclosed. A thin layer of oxide is deposited on a silicon-on-insulator structure and a layer of polysilicon is deposited on the thin oxide layer that is patterned and etched to form an extrinsic base region of the transistor. The polysilicon extrinsic base is very heavily doped and the thin oxide layer acts as both a diffusion stop and an etch stop during the formation of the extrinsic base. A silicon edge contact region is formed of selective epitaxy or polysilicon to connect the extrinsic base to the intrinsic base formed in the silicon-on-insulator layer.

10 Claims, 4 Drawing Sheets

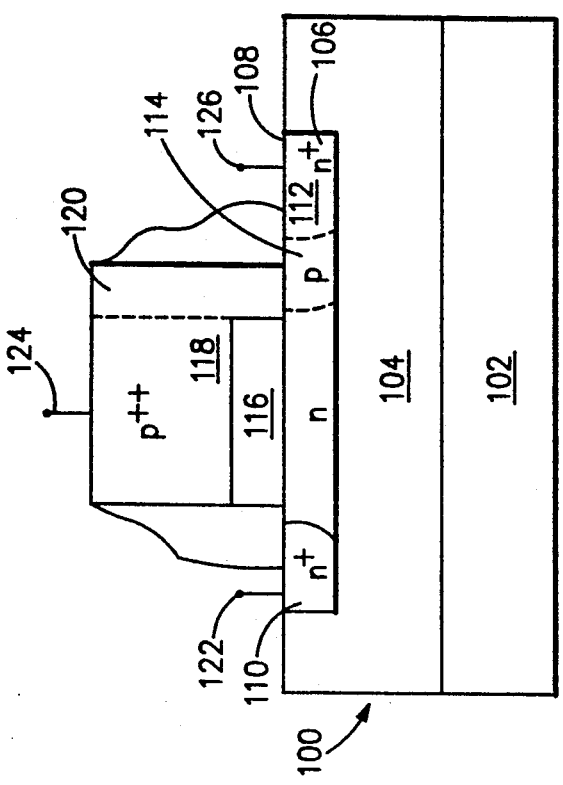
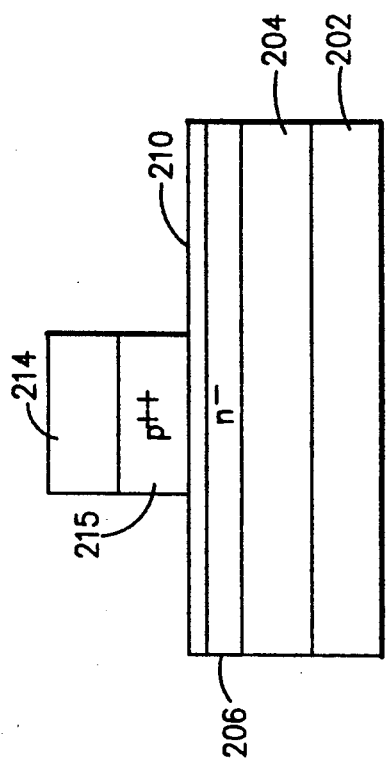
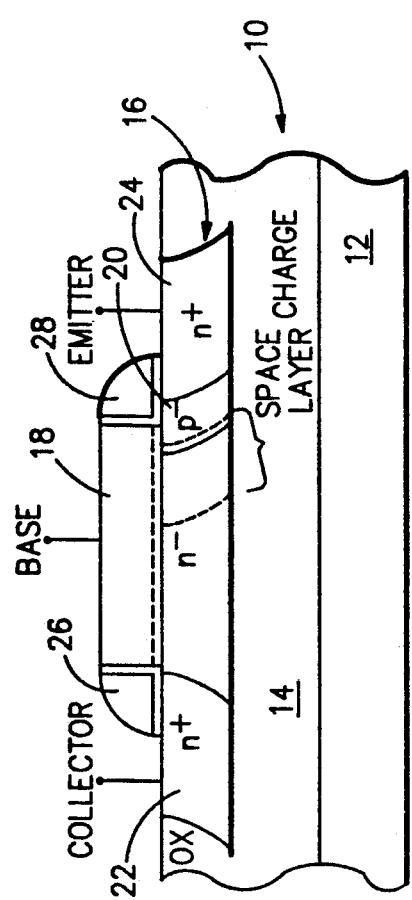
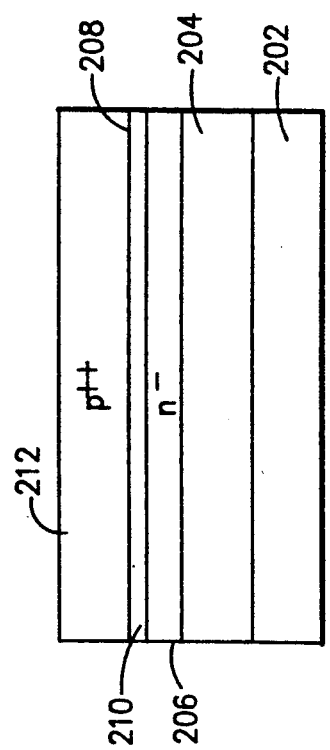

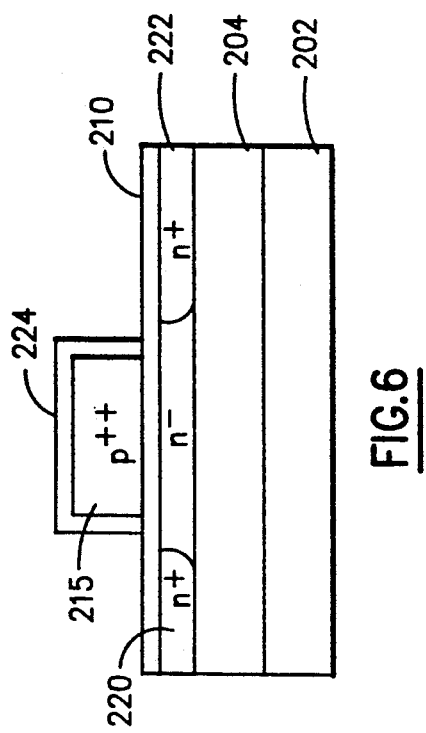
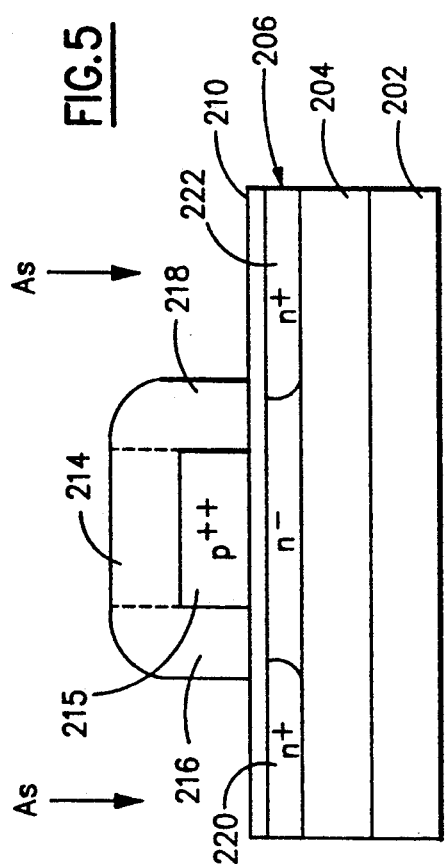
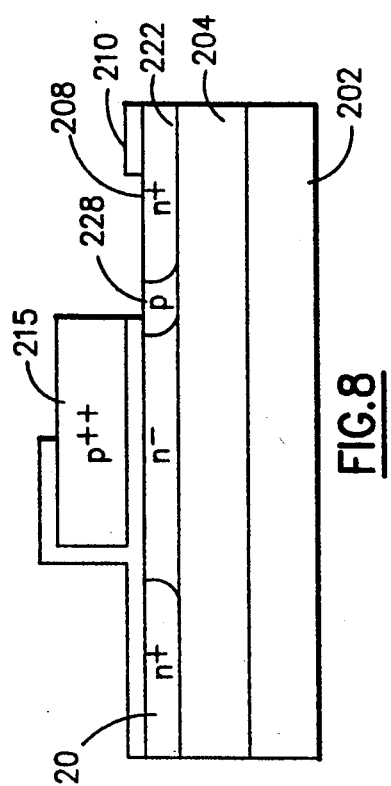
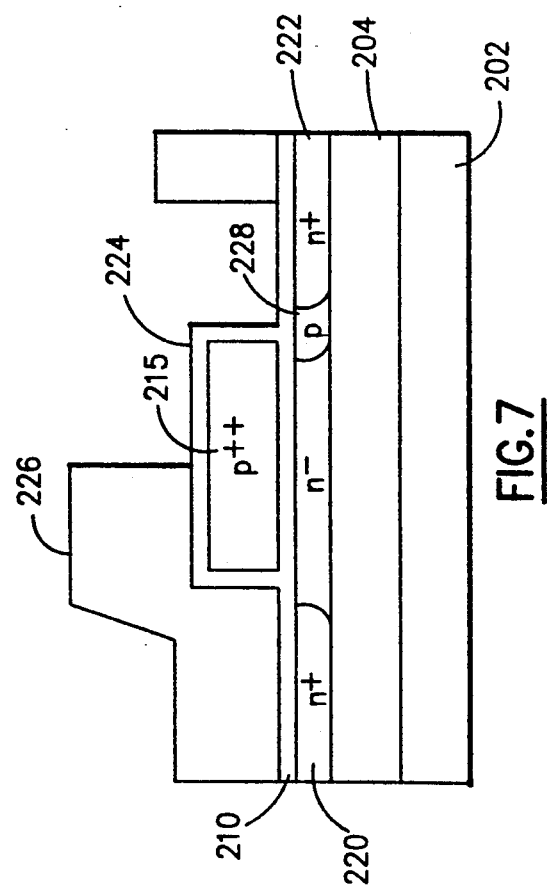

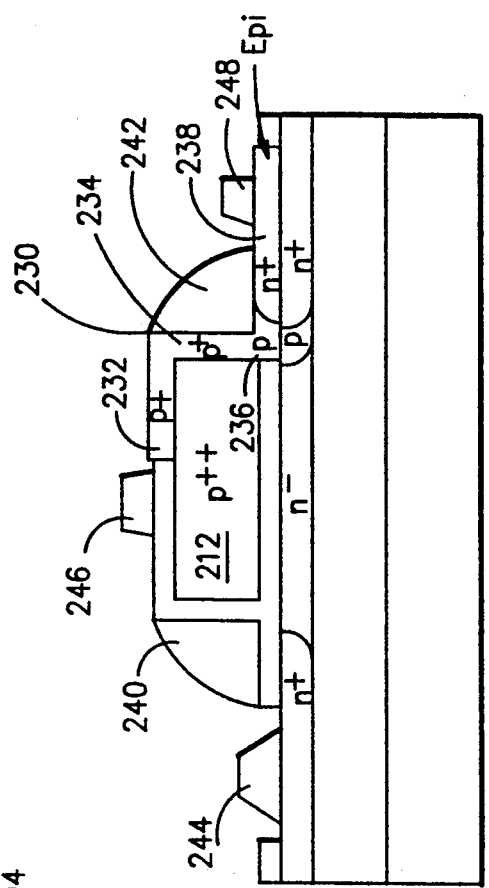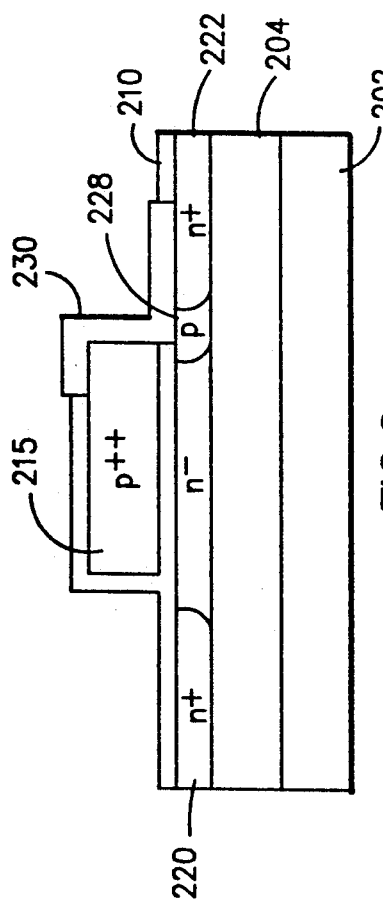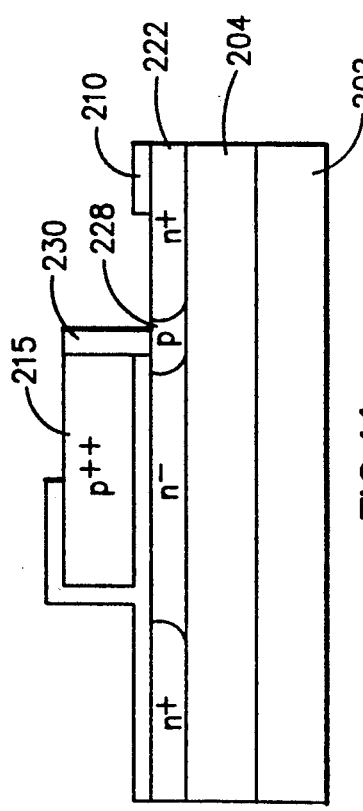

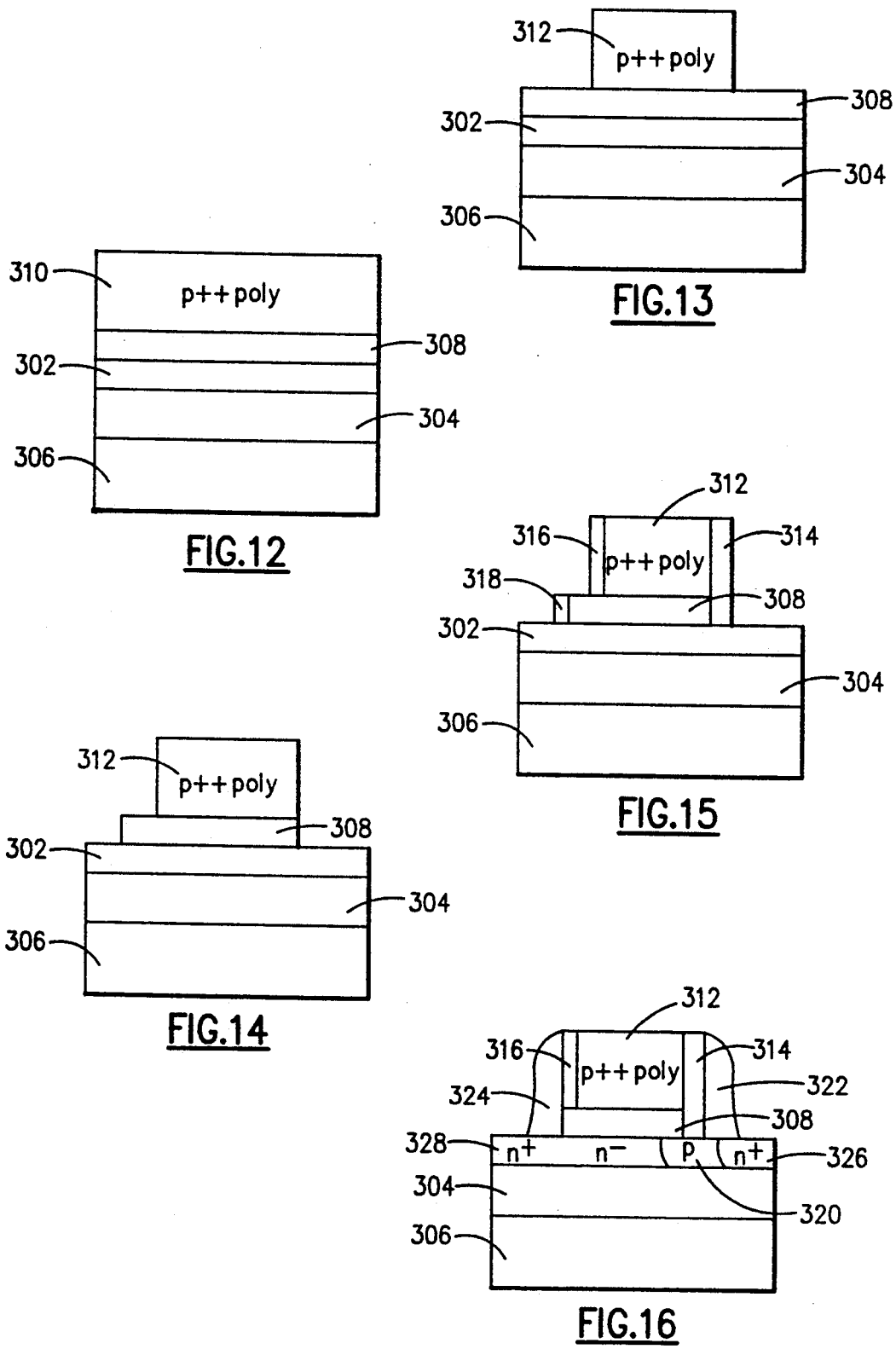

SOI LATERAL BIPOLAR TRANSISTOR WITH EDGE-STRAPPED BASE CONTACT AND METHOD OF FABRICATING SAME

This application is a continuation of application Ser. No. 07/890,357 filed on Sep. 22, 1992, abandoned, which is a continuation of application Ser. No. 07/622,986 filed on Dec. 6, 1990, abandoned.

BACKGROUND OF THE INVENTION

1. Field of the Invention

The present invention relates to silicon-on-insulator devices and more particularly, to lateral bipolar transistors formed on silicon-on-insulator structures.

2. Description of the Prior Art

There is renewed interest in fabricating MOSFETs and bipolar transistors on thin silicon films on insulator structures. All such structures have inherent problems that are associated with parasitic circuit elements arising from junction capacitance. These effects become a more severe problem as devices are made smaller. A way to circumvent the problem is to fabricate devices in small islands of silicon on an insulating substrate. In such devices, junction capacitances are minimized, as devices can be placed closer to each other, because isolation is eliminated. In addition, such devices are more resistant to soft errors. Furthermore, silicon-on-insulator devices are potentially faster and more reliable. It is furthermore possible to obtain high performance complementary bipolar devices on such films. The processes for fabrication of bipolar and MOS transistors on silicon-on-insulator (SOI) structures are highly compatible.

The initial approach to fabricating such structures is to grow silicon epitaxially on a substrate of sapphire. An example of such a device can be found in U.S. Pat. No. 4,050,965, which describes the process for the simultaneous fabrication of a CMOS transistor and a bipolar device formed laterally in the epitaxial layer. Another example of a bipolar device formed in a silicon-on-insulator structure can be found in U.S. Pat. No. 4,792,837 which discloses an orthogonal bipolar device in which the base and collector are formed in a first layer of silicon and the emitter is formed in a second layer of silicon deposited directly on the base region. Another lateral bipolar transistor is described by Dennard et al. in IBM Technical Disclosure Bulletin, Vol. 32, No. 6B, November 1989, which discloses an elevated base contact of heavily doped polysilicon formed on the active silicon layer.

An example of the device proposed by Dennard et al. is shown in FIG. 1 herein. FIG. 1 depicts device 10 having a substrate 12 on which is formed an oxide layer 14. A layer of silicon 16 is formed on oxide layer 14 and is lightly doped. The elevated extrinsic base-contact 18 is formed by a deposition of a heavily doped p-type polysilicon film and patterning by lithographic techniques. Patterned photoresist masking techniques are used to introduce p-type doping into layer 16 to form intrinsic base 20, and to introduce n-type doping to form collector 22 and emitter 24. Insulating side wall spacers 26 and 28 are formed on the edges of the extrinsic base contact by well-known insulator deposition and reactive-ion-etching methods.

While the Dennard et al. device has lower base and emitter resistances than conventional structures and most junction capacitances are reduced, thereby improving the device speed, the structure suffers from several drawbacks. The base polysilicon has to be as heavily doped as possible to achieve low base resistance. Furthermore, this doping has to be done before emitter drive-in and the intrinsic base doping. During these steps, there is a potential for the base dopant to diffuse into the lightly doped collector region. In the fabrication of an NPN transistor, it is very difficult to control the p+ diffusion depth from the polysilicon into the underlying silicon. In a thin SOI film, this problem is aggravated. A second problem is due to lack of an etch stop for the polysilicon etching step. When the base is patterned, there is no etch stop between the polysilicon and single crystalline silicon, thus there is a possibility of etching into the single crystal silicon film. This is a major problem when thin epitaxial films are used. In addition, the structure has a very large base-collector capacitance, caused by overlap between the heavily doped base and the lightly doped collector.

SUMMARY OF THE INVENTION

The present invention is directed to a silicon-on-insulator lateral bipolar transistor that eliminates all the above-mentioned problems by placing a dielectric film between the heavily doped base polysilicon and the lightly doped collector region below the polysilicon base. The oxide layer below the polysilicon reduces the base-collector capacitance, acts as an etch stop for the patterning of the base and acts as a diffusion stop for the heavy base dopant. The transistor of the invention eliminates all unnecessary junction capacitances. The device includes a silicon edge-strap contact for connecting the extrinsic base to the intrinsic base.

Also disclosed is a method for facilitating fabrication of the bipolar transistor of the present invention. The method includes the use of selective silicon epitaxy or deposited polysilicon to form the edge-strap contact between the narrow intrinsic base and the polysilicon extrinsic base contact formed over the thin oxide film on the SOI structure. The method disclosed is compatible with standard CMOS processes and can be used in the development of a complementary bi-CMOS process on silicon-on-insulator structures.

BRIEF DESCRIPTION OF THE DRAWINGS

FIG. 1 is a cross-sectional view of the Dennard et al. prior art lateral bipolar silicon-on-insulator transistor.

FIG. 2 a cross-sectional view of the silicon-on-insulator lateral bipolar transistor of the present invention.

FIGS. 3–16 are cross-sectional views showing the transistor of the present invention in various stages of fabrication.

DETAILED DESCRIPTION OF THE INVENTION

In the following description of the invention, specific p and n conductivity type materials and regions are indicated. These indications are by way of example and shall not be deemed to limit the teachings of the present invention. It will be understood that devices having opposite p and n arrangements are considered equivalent in all pertinent respects to the devices described herein. In addition, well-known lithographic masking patterning and etching steps are employed in the method of fabrication described, and are therefore not described in detail.

Referring now to the drawings, there is shown in FIG. 2 a silicon-on-insulator lateral bipolar transistor 100 of the present invention. The transistor 100 includes a substrate 102 on which is formed a layer of oxide 104. A layer of lightly doped n-type single crystalline silicon 106 is formed on the oxide layer 104 with a substantially planar surface 108. Within the silicon layer 106, there is formed heavily doped n-type collector and emitter regions 110 and 112 which extended from surface 108. Also formed in layer 106 is an intrinsic base region 114 which also extends from surface 108 and which is lightly doped p-type. An insulator layer 116 is formed on the planar surface 108 of silicon layer 106.

A polysilicon extrinsic base region 118 is formed on the insulator layer 116. The extrinsic base region 118 is very heavily doped p-type. A silicon edge contact region 120 is formed on one side edge of the base 118 and on the surface 108 above intrinsic base 114. The edge contact 120 is p doped on portions adjacent the extrinsic and intrinsic bases. The edge contact region 120 provides an electrical connection between the intrinsic base 114 and the extrinsic base 118. Metallic contacts 122, 124, and 126 are provided to complete the device. As will be described more fully hereinafter, the insulator layer 116 allows the extrinsic base to be very heavily doped because it acts as a diffusion stop to prevent the doping from being introduced into the collector, and the layer 116 also acts as an etch stop when forming the base 118.

The starting material for the fabrication of the lateral bipolar transistor of the present invention is a silicon-on-insulator structure. A silicon-on-insulator structure is basically comprised of a layer of insulating material formed on a substrate and islands of silicon formed on the insulating layer. A silicon-on-insulator structure may be formed by any known technique such as by mesa etching or by standard field oxide isolation techniques. Shown in FIG. 3 is a cross-section of a partial silicon-on-insulator structure including a substrate 202 on which is formed a layer of oxide 204 and a thin layer of single crystalline silicon 206. The silicon layer 206 is lightly doped n-type. The actual thicknesses of the layers will depend on device application and the thicknesses that are described herein are illustrative only. As an example, the silicon layer 206 may be about 100–300 nm thick. The silicon island 206 has a substantially planar surface 208.

After providing the silicon-on-insulator structure, a layer of about 50–200 nm of insulator 210 is grown on the surface 208. The thickness of the insulator layer 210 will be determined by the base collector capacitance. If necessary, a layer of a different insulator (not shown) can be added on the first insulator layer 210 to further reduce the diffusion of p-type doping into the lightly doped collector region. For example, the first insulator layer 210 may be an oxide such as silicon dioxide and the second insulator layer may be a nitride such as silicon nitride. Next, a layer 212 of approximately 200–400 nm of polysilicon is deposited by, for example, LPCVD. Next, a very heavy p++ implant is performed. During this implant, the insulator layer 210 acts as a diffusion stop to prevent the heavy doping in the polysilicon layer 212 from being introduced into the lightly doped layer 206. Because of the insulator layer 210, the polysilicon layer 212 can be doped with a carrier concentration of up to $10^{21}$ c$^{-3}$, at least two orders of a magnitude higher than could be safely implanted in prior art SOI devices.

As shown in FIG. 4, a layer 214 of approximately 200 nm of nitride is deposited on the polysilicon layer 212 and the nitride and polysilicon layers are reactive ion etched to define an extrinsic base region 215.

As shown in FIG. 5, about 200 nm of nitride is then deposited and etched back to form thick side wall spacers 216 and 218. Emitter and collector n+ implants of arsenic are performed next to form collector region 220 and emitter region 222.

As shown in FIG. 6, the nitride regions 214, 216 and 218 are stripped away, and a high temperature anneal of about 950° C. in oxygen is used to move the emitter junction by 50 nm. This will result in the emitter-base junction being away from the damage area. During the anneal, a layer 224 of thermal oxide is formed on the polysilicon extrinsic base 215.

As shown in FIG. 7, a patterned photoresist mask 226 is formed leaving exposed one side edge of the base area 215. A p-type implant of boron is performed to form intrinsic base region 228. Different implantation energies and doses can be used to make the p-type doping uniform at all depths. In addition, the implant angle can be adjusted to enhance the penetration under the edge of the extrinsic base region.

As shown in FIG. 8, the portion of oxide layer 224 and the portion of insulator layer 210 exposed through the photoresist mask 226 are stripped away by wet etching or isotropic plasma etching and thereafter the mask is stripped. This exposes the surface 208 of emitter region 222 and base region 228 as well as the side edge, and a portion of the upper edge, of the base 215.

As shown in FIG. 9, a silicon side edge contact 230 is formed on the exposed regions of surface 208 and extrinsic base region 215. Edge contact 230 may be about 50–100 nm thick. The edge contact 230 may be formed by selective silicon epitaxy or alternatively by depositing polysilicon or epitaxial silicon over the entire structure and etching back the excess polysilicon or silicon to form the edge contact as shown in FIG. 9. If polysilicon or epitaxial silicon is deposited to form the edge contact 230, the excess polysilicon or silicon can be etched by covering the base polysilicon contact with a negative mask of the previous photoresist mask 226 and isotropic etching the extra polysilicon or silicon. If selective silicon deposition is used, then no extra processing is needed. In addition, if selective epitaxy growth is used, a portion of the contact 230 connected to the vertical side edge of the extrinsic base 215 will form polysilicon, while the laterally extending portions of the contact 230 will form single crystalline silicon.

Due to auto-doping and deposition temperature, as shown in FIG. 10, the epitaxial film or the polysilicon layer is automatically heavily doped p-type in the portions 232 and 234 of the contact 230 that contacts extrinsic base 215. In addition, the contact 230 is also auto-doped p-type on the portion 236 that contacts intrinsic base 228. The contact 230 is also auto-doped n-type in the portion 238 of the contact 230 that is connected to emitter region 222. In addition, or in the alternative, the edge contact 230 may be doped by ion implantation. The pn junction between the portions 236 and 238 of contact 230 provides isolation to prevent shorting. If further safety against shorting is needed, edge contact 230 can be etched back to form a sidewall edge contact as shown in FIG. 11.

The remainder of the process for forming a transistor uses standard well known techniques for forming side spacers 240 and 242 and metallic contacts 244, 246 and 248 as shown in FIG. 10. Typically, refractory or refractory metal silicide contacts will be formed.

The process described above is compatible with CMOS processing. To combine the process of the present invention with a CMOS process, the initial insulator and polysilicon would be used as the CMOS gate oxide and gate material. Alternatively, the base-collector separation insulator is removed from the FET area before the gate oxide is grown and polysilicon is deposited everywhere. The source-drain implant can be formed before putting the 200 nm nitride spacers, or after the emitter drive-in.

In a variation in the method of forming the transistor described above, the base side edge contact is formed before the base implant is performed. Thereafter, dielectric sidewall spacers are formed and then the emitter implant and collector implant are performed. Turning now to FIGS. 12-16, after obtaining an SOI structure of silicon 302 and oxide 304 formed on silicon substrate 306, and doping layer 302 to the collector n− level, an insulator 308 is deposited, and then a 200-500 nm p++ layer of polysilicon 310 for the extrinsic base is deposited. The extrinsic base is patterned, and only the p++ polysilicon is etched to form extrinsic base 312 as shown in FIG. 13.

Next, the collector side of extrinsic 312 is covered by a photoresist and the insulator 308 is etched as shown in FIG. 14. Silicon side edge spacers 314, 316 and 318 are formed by depositing polysilicon or epitaxial silicon everywhere and etching back, or selective silicon epitaxy and etching back as shown in FIG. 15. The exposed insulator 308 over the collector and the side edge spacer 318 are selectively etched and the base p implant is performed to form intrinsic base 320. If necessary, the collector region can be covered by a photoresist during the base implant. Next, dielectric spacers 322 and 324 are formed, followed by n+ implants to form the emitter region 326 and the collector region 328.

The silicon-on-insulator bipolar transistor with edge-strapped base contact of the invention eliminates all the unnecessary parasitic junction capacitances, since the base and collector junction capacitance is minimized. The insulator between the base and collector allows the p++ doping of the base polysilicon contact and also acts as an etch stop when forming the base.

While the invention has been particularly shown and described with respect to illustrative and preferred embodiments thereof, it will be understood by those skilled in the art that the foregoing and other changes in form and detail may be made therein without departing from the spirit and scope of the invention which should be limited only by the scope of the appended claims.

Having thus described the invention, what is claimed as new and what is desired to be secured by Letters Patent is:

1. A lateral bipolar transistor formed on a silicon-on-insulator structure comprising:
   a substrate having a layer of oxide formed thereon and a layer of silicon formed on said oxide layer, said layer of silicon having a substantially planar surface;
   a collector region of a first conductivity type extending from said surface of said silicon layer, an emitter region of said first conductivity type extending form said surface of said silicon layer, and an intrinsic base region of a second conductivity type extending from said surface of said silicon layer, said intrinsic base region being contiguous to said emitter region and intermediate said emitter and collector regions;
   a layer of insulator formed on said collector region;
   a strip polysilicon extrinsic base region of said second conductivity type formed on said insulator layer, said insulator layer being sandwiched between said collector region and said extrinsic base region; and
   a silicon edge contact region of said second conductivity type connected to an outside sidewall of said strip extrinsic base region and said surface of said intrinsic base region.

2. The transistor of claim 1 wherein said edge contact is formed of selective epitaxial silicon.

3. The transistor of claim 2 wherein said edge contact is formed of at least a first portion and a second portion, said first portion contacting the sidewall of said extrinsic base and being formed of polysilicon, said second portion contacting the surface of said intrinsic base region and being formed of single crystal silicon.

4. The transistor of claim 1 wherein said edge contact is formed of polysilicon.

5. The transistor of claim 1 wherein said edge contact includes first and second portions, said first and second portions being of said second conductivity type, the first portion being connected to the sidewall of said extrinsic base and the second portion being connected to the surface of said intrinsic base, and said edge contact further including a third portion, said third portion being of said first conductivity type and connected to said surface of said emitter region.

6. The transistor of claim 1, further including metallic contacts connected to each of the emitter, extrinsic base, and collector regions, respectively.

7. The transistor of claim 1, wherein said layer of silicon is about 100-300 nm thick, said insulator layer is about 50-200 nm thick, said polysilicon extrinsic base is about 200-400 nm thick and said edge contact is about 50-100 nm thick.

8. The transistor of claim 1, wherein said insulator layer is one of an oxide and a nitride.

9. The transistor of claim 1, wherein said insulator layer comprises a first layer of a first insulator material and a second layer of a second insulator material.

10. The transistor of claim 9, wherein said first insulator material is an oxide and said second insulator material is a nitride.

* * * * *